US012615758B2

(12) United States Patent
Lu

(10) Patent No.: US 12,615,758 B2
(45) Date of Patent: Apr. 28, 2026

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei City (CN)

(72) Inventor: Jingwen Lu, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 338 days.

(21) Appl. No.: 18/363,833

(22) Filed: Aug. 2, 2023

(65) Prior Publication Data

US 2023/0389301 A1     Nov. 30, 2023

Related U.S. Application Data

(63) Continuation of application No. PCT/CN2022/076164, filed on Feb. 14, 2022.

(30) Foreign Application Priority Data

Sep. 29, 2021     (CN) .......................... 202111151974.6

(51) Int. Cl.
*H10B 12/00*          (2023.01)
(52) U.S. Cl.
CPC .......... *H10B 12/053* (2023.02); *H10B 12/02* (2023.02); *H10B 12/488* (2023.02)
(58) Field of Classification Search
CPC ...... H10B 12/02; H10B 12/053; H10B 12/34; H10B 12/488; H10D 84/0149; H10D 84/0151; H10D 84/038
See application file for complete search history.

(56) References Cited

U.S. PATENT DOCUMENTS 6,271,590 B1 *   8/2001   Akram .............. H01L 21/28044
                                                          257/748
10,043,812 B1     8/2018   Chang et al.
                        (Continued)

FOREIGN PATENT DOCUMENTS

CN          105097641 A      11/2015
CN          109509751 A       3/2019
                    (Continued)

OTHER PUBLICATIONS

International Search Report cited in PCT/CN2022/076164 mailed Mar. 31, 2022, 9 pages.

*Primary Examiner* — Britt Hanley
*Assistant Examiner* — Kevin Quinto
(74) *Attorney, Agent, or Firm* — Syncoda LLC; Feng Ma

(57) ABSTRACT

The present disclosure provides a method of manufacturing a semiconductor structure and a semiconductor structure. The method includes: providing an initial structure, where the initial structure includes a substrate and initial word line structures, and each of the initial word line structures includes an initial conductive structure; forming isolation trenches, where a remaining part of the substrate is isolated by the isolation trenches to form a plurality of active area structures independent of each other, the active area structures cover first parts of the initial word line structures, and the isolation trenches expose second parts of the initial word line structures; and removing part of the second part of the initial word line structure.

18 Claims, 17 Drawing Sheets

(56)           References Cited

U.S. PATENT DOCUMENTS

| | | | |
|---|---|---|---|
| 2010/0311215 A1* | 12/2010 | Yoo | H10D 64/027 |
| | | | 438/270 |
| 2014/0063934 A1* | 3/2014 | Oh | H10D 64/513 |
| | | | 365/182 |
| 2014/0110786 A1* | 4/2014 | Kim | H10B 12/053 |
| | | | 257/365 |
| 2016/0284640 A1 | 9/2016 | Wang et al. | |
| 2018/0323190 A1 | 11/2018 | Feng et al. | |
| 2020/0243537 A1 | 7/2020 | Li et al. | |
| 2022/0077289 A1 | 3/2022 | Luo et al. | |

FOREIGN PATENT DOCUMENTS

| | | | |
|---|---|---|---|
| CN | 111430348 A | 7/2020 | |
| CN | 113270405 A | 8/2021 | |

* cited by examiner

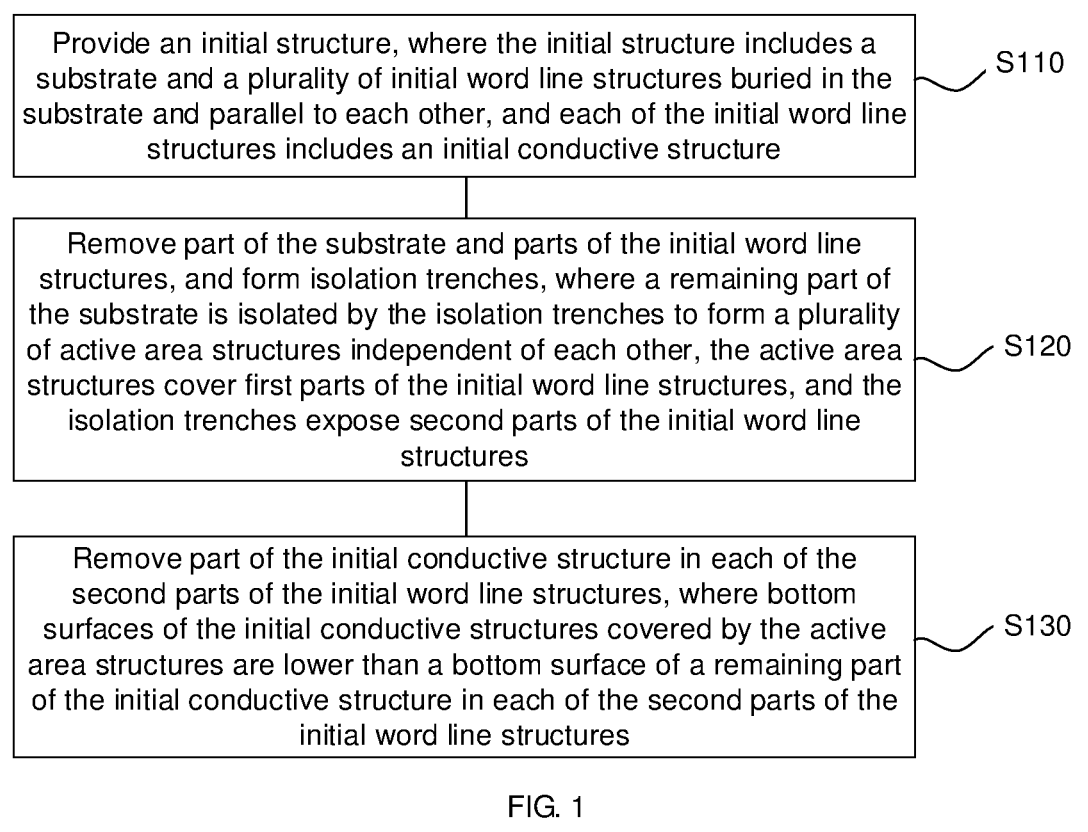

Provide an initial structure, where the initial structure includes a substrate and a plurality of initial word line structures buried in the substrate and parallel to each other, and each of the initial word line structures includes an initial conductive structure — S110

Remove part of the substrate and parts of the initial word line structures, and form isolation trenches, where a remaining part of the substrate is isolated by the isolation trenches to form a plurality of active area structures independent of each other, the active area structures cover first parts of the initial word line structures, and the isolation trenches expose second parts of the initial word line structures — S120

Remove part of the initial conductive structure in each of the second parts of the initial word line structures, where bottom surfaces of the initial conductive structures covered by the active area structures are lower than a bottom surface of a remaining part of the initial conductive structure in each of the second parts of the initial word line structures — S130

FIG. 1

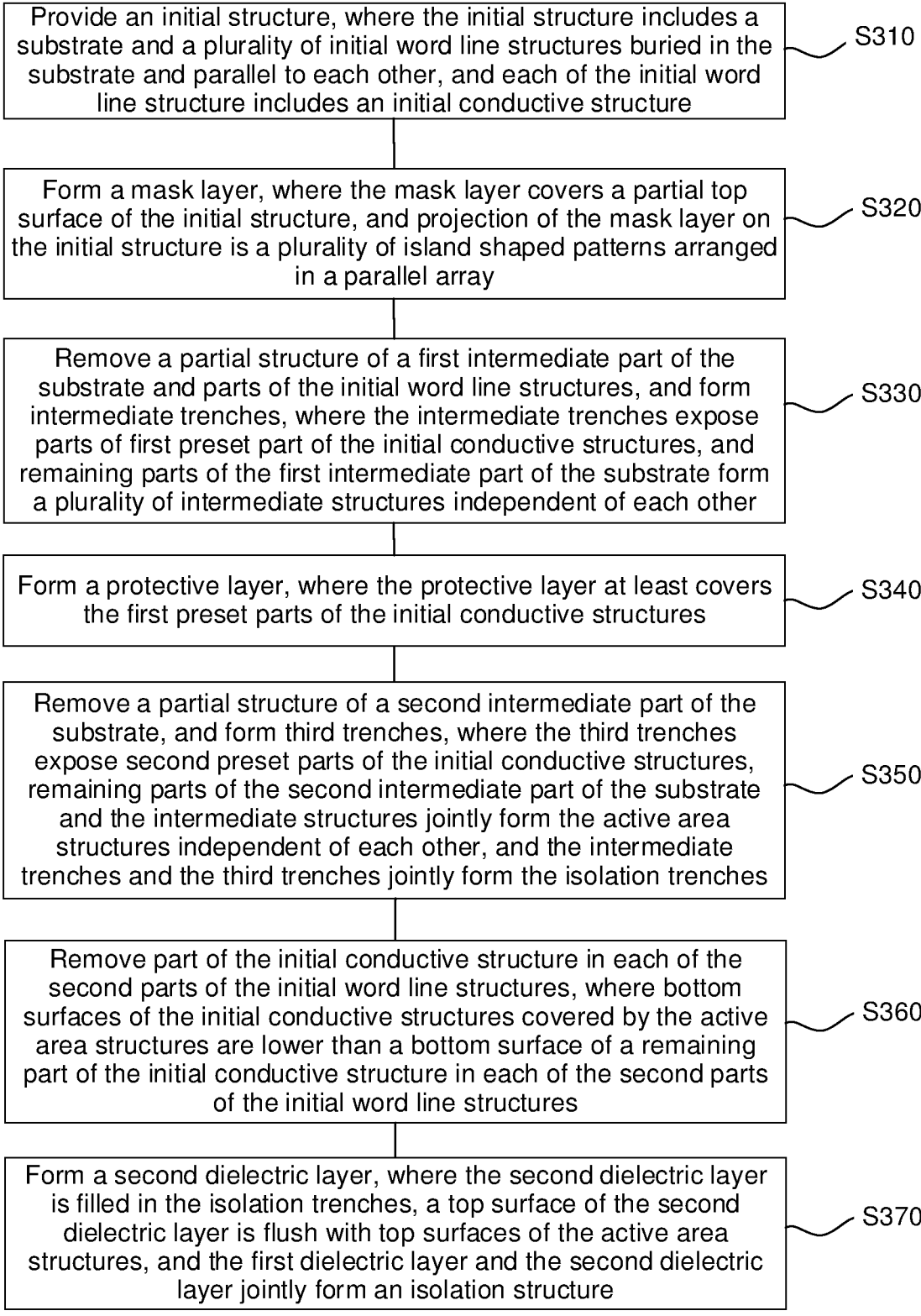

Provide an initial structure, where the initial structure includes a substrate and a plurality of initial word line structures buried in the substrate and parallel to each other, and each of the initial word line structure includes an initial conductive structure — S310

Form a mask layer, where the mask layer covers a partial top surface of the initial structure, and projection of the mask layer on the initial structure is a plurality of island shaped patterns arranged in a parallel array — S320

Remove a partial structure of a first intermediate part of the substrate and parts of the initial word line structures, and form intermediate trenches, where the intermediate trenches expose parts of first preset part of the initial conductive structures, and remaining parts of the first intermediate part of the substrate form a plurality of intermediate structures independent of each other — S330

Form a protective layer, where the protective layer at least covers the first preset parts of the initial conductive structures — S340

Remove a partial structure of a second intermediate part of the substrate, and form third trenches, where the third trenches expose second preset parts of the initial conductive structures, remaining parts of the second intermediate part of the substrate and the intermediate structures jointly form the active area structures independent of each other, and the intermediate trenches and the third trenches jointly form the isolation trenches — S350

Remove part of the initial conductive structure in each of the second parts of the initial word line structures, where bottom surfaces of the initial conductive structures covered by the active area structures are lower than a bottom surface of a remaining part of the initial conductive structure in each of the second parts of the initial word line structures — S360

Form a second dielectric layer, where the second dielectric layer is filled in the isolation trenches, a top surface of the second dielectric layer is flush with top surfaces of the active area structures, and the first dielectric layer and the second dielectric layer jointly form an isolation structure — S370

FIG. 3

METHOD OF MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2022/076164, filed on Feb. 14, 2022, which claims the priority to Chinese Patent Application No. 202111151974.6, titled "METHOD OF MANUFACTURING SEMICONDUCTOR STRUCTURE AND SEMICONDUCTOR STRUCTURE" and filed on Sep. 29, 2021. The entire contents of International Application No. PCT/CN2022/076164 and Chinese Patent Application No. 202111151974.6 are incorporated herein by reference.

TECHNICAL FIELD

The present disclosure relates to, but is not limited to, a method of manufacturing a semiconductor structure and a semiconductor structure.

BACKGROUND

When activated and repeatedly refreshed, a word line in the memory matrix generates noise or interference to adjacent word lines. If the frequency of activating the word line is excessively high, the memory cells of the adjacent word lines, before activated and refreshed, are subject to charge loss and leakage. This causes an error in data located in one or more memory cells of the adjacent word lines. Such phenomenon is called the Row Hammer Effect.

SUMMARY

An overview of the subject described in detail in the present disclosure is provided below, which is not intended to limit the protection scope of the claims.

The present disclosure provides a method of manufacturing a semiconductor structure and a semiconductor structure.

A first aspect of the present disclosure provides a method of manufacturing a semiconductor structure. The method of manufacturing a semiconductor structure includes:

providing an initial structure, where the initial structure includes a substrate and a plurality of initial word line structures buried in the substrate and parallel to each other, and each of the initial word line structures includes an initial conductive structure;

removing part of the substrate and parts of the initial word line structures, and forming isolation trenches, where a remaining part of the substrate is isolated by the isolation trenches to form a plurality of active area structures independent of each other, the active area structures cover first parts of the initial word line structures, and the isolation trenches expose second parts of the initial word line structures; and removing part of the initial conductive structure in each of the second parts of the initial word line structures, where bottom surfaces of the initial conductive structures covered by the active area structures are lower than a bottom surface of a remaining part of the initial conductive structure in each of the second parts of the initial word line structures.

A second aspect of the present disclosure provides a semiconductor structure, including:

a base, where a plurality of active area structures independent of each other are disposed on the base;

an isolation structure, where the isolation structure is located around the active area structures; and word line structures, where each of the word line structures includes a conductive structure, the conductive structure includes a contact part in the active area structure and a connecting part in the isolation structure, and a bottom surface of the contact part of the conductive structure is lower than a bottom surface of the connecting part of the conductive structure.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

FIG. 1 is a flowchart of a method of manufacturing a semiconductor structure according to an exemplary embodiment;

FIG. 3 is a flowchart of a method of manufacturing a semiconductor structure according to an exemplary embodiment;

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

An exemplary embodiment of the present disclosure provides a method of manufacturing a semiconductor structure. As shown in FIG. 1, FIG. 1 is a flowchart of a method of manufacturing a semiconductor structure according to an exemplary embodiment of the present disclosure. FIGS. 5 to 33 are schematic diagrams of various stages of the method of manufacturing a semiconductor structure. The method of manufacturing a semiconductor structure is described below with reference to FIGS. 5 to 33.

It should be noted that in this embodiment of the present disclosure, direction A-A is an extension direction of the initial word line structure, and direction B-B is an extension direction of an active area structure.

The semiconductor structure is not limited in some embodiments. The semiconductor structure is described below by taking a dynamic random access memory (DRAM) as an example, which, however, is not limited in some embodiments, and the semiconductor structure in some embodiments may further be other structures.

As shown in FIG. 1, an exemplary embodiment of the present disclosure provides a method of manufacturing a semiconductor structure, including:

Step S110: Provide an initial structure, where the initial structure includes a substrate and a plurality of initial word line structures buried in the substrate and parallel to each other, and each of the initial word line structures includes an initial conductive structure.

Figure 6:
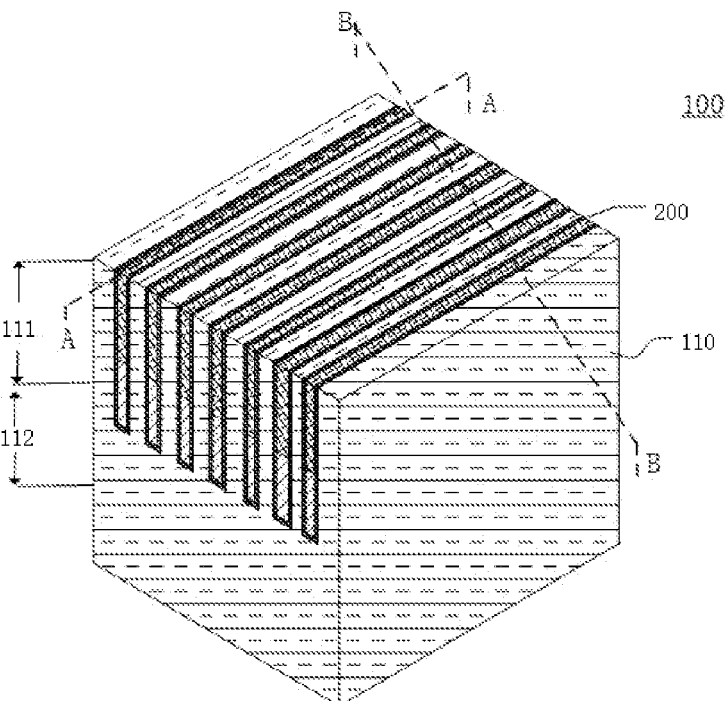
FIG. 6 is a schematic diagram of an initial structure provided in a method of manufacturing a semiconductor structure according to an exemplary embodiment.
Figure 7:
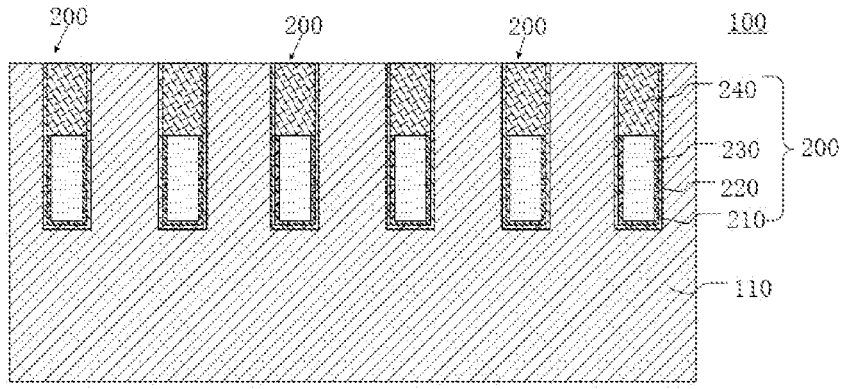
FIG. 7 is a cross-sectional view taken along A-A in FIG. 6.
Figure 8:
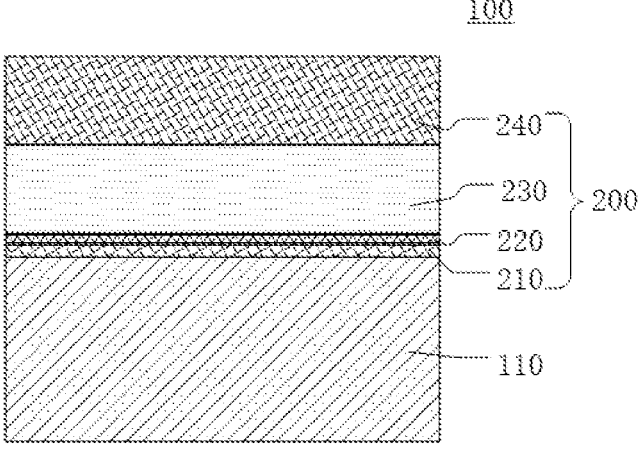
FIG. 8 is a cross-sectional view taken along B-B in FIG. 6.

As shown in FIGS. 6, 7, and 8, the substrate 110 may be made of a semiconductor material. The semiconductor material may be one or more selected from the group consisting of silicon, germanium, a silicon-germanium compound, and a silicon-carbon compound. The initial word line structures 200 are parallel to each other and are spaced apart in the substrate 110.

Step S120: Remove part of the substrate and parts of the initial word line structures, and form isolation trenches, where a remaining part of the substrate is isolated by the isolation trenches to form a plurality of active area structures independent of each other, the active area structures cover first parts of the initial word line structures, and the isolation trenches expose second parts of the initial word line structures.

Figure 20:
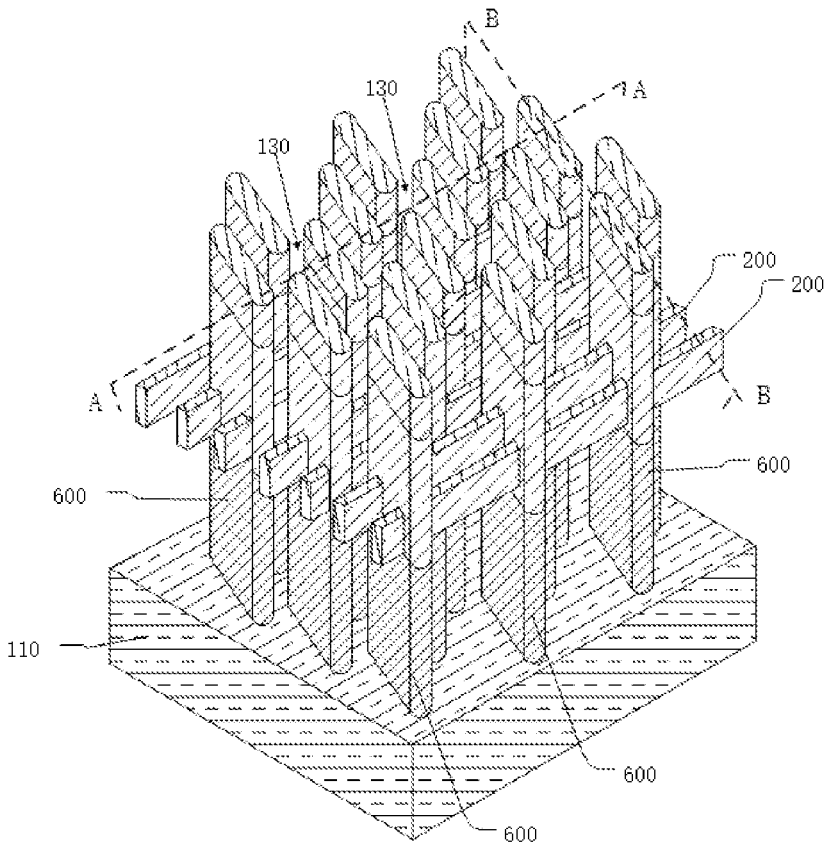
FIG. 20 is a schematic diagram of forming an isolation trench in a method of manufacturing a semiconductor structure according to an exemplary embodiment.
Figure 21:
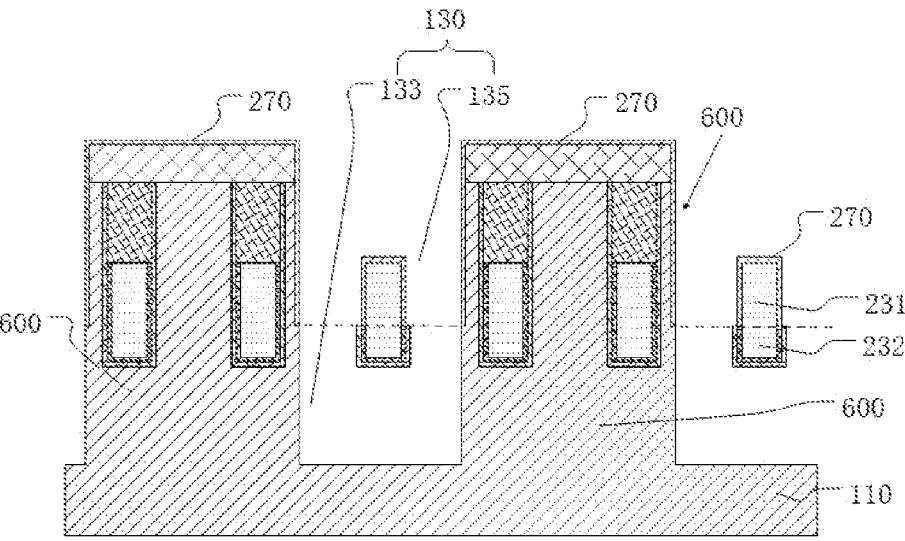
FIG. 21 is a cross-sectional view taken along A-A in FIG. 20.
Figure 22:
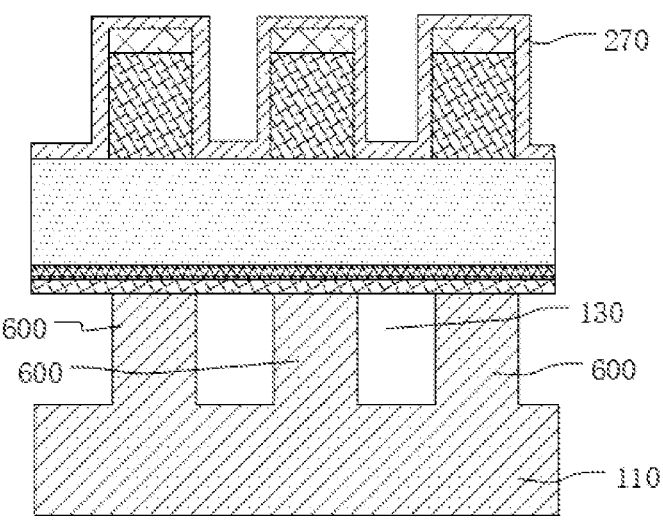
FIG. 22 is a cross-sectional view taken along B-B in FIG. 20.

As shown in FIGS. 20, 21, and 22, the part of the substrate 110 and parts of the initial word line structures 200 can be removed through dry etching or wet etching, to form the isolation trenches 130 in the initial structure 100. Remaining parts of the substrate 110 form a plurality of active area structures 600. The active area structures 600 are isolated by the isolation trenches 130 and are independent of each other.

As shown in FIGS. 20 and 21, two initial word line structures 200 are provided in each active area structure 600, and two ends of the active area structure 600 each intersect one initial word line structure 200. The first part 201 of the initial word line structure 200 is disposed in the active area structure 600 and covered by the active area structure 600, and the second part 202 of the initial word line structure 200 is exposed in the isolation trench 130. As shown in FIGS. 20 and 22, the first parts 201 of the same initial word line structure 200 located in different active area structures 600 are connected by the second parts 202 of the initial word line structure 200.

Step S130: Remove part of the initial conductive structure in each of the second parts of the initial word line structures, where bottom surfaces of the initial conductive structures covered by the active area structures are lower than a bottom surface of a remaining part of the initial conductive structure in each of the second parts of the initial word line structures.

Figures 26, 27:
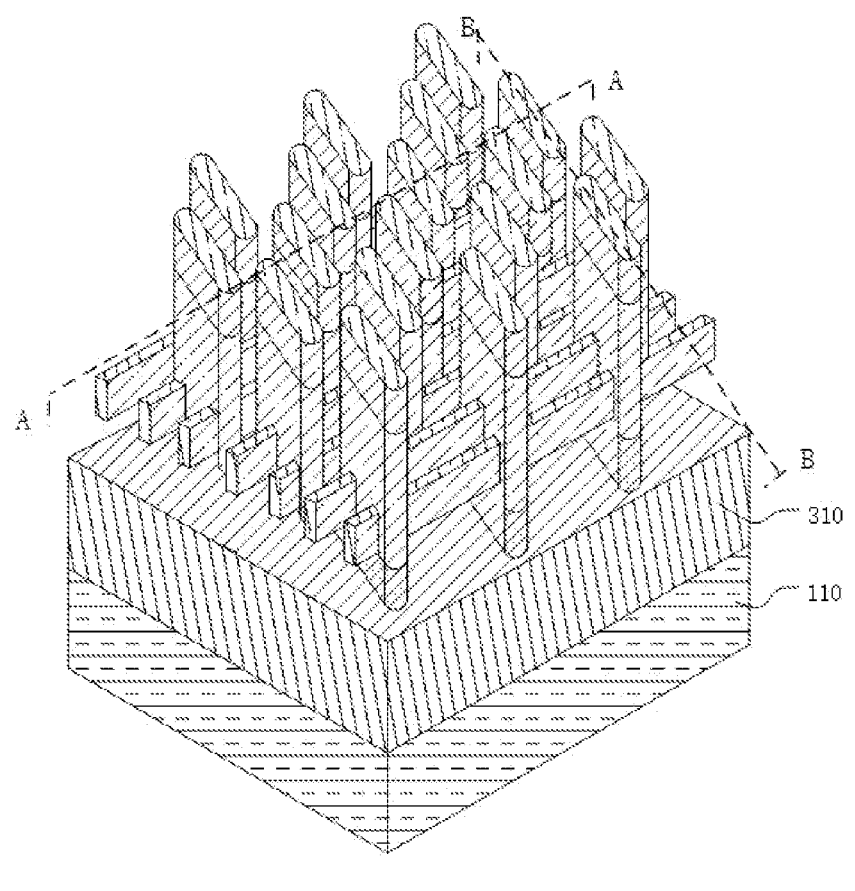
FIG. 26 is a schematic diagram of removing part of a second part of an initial word line structure in a method of manufacturing a semiconductor structure according to an exemplary embodiment.
FIG. 27 is a cross-sectional view taken along A-A in FIG. 26.
Figure 28:
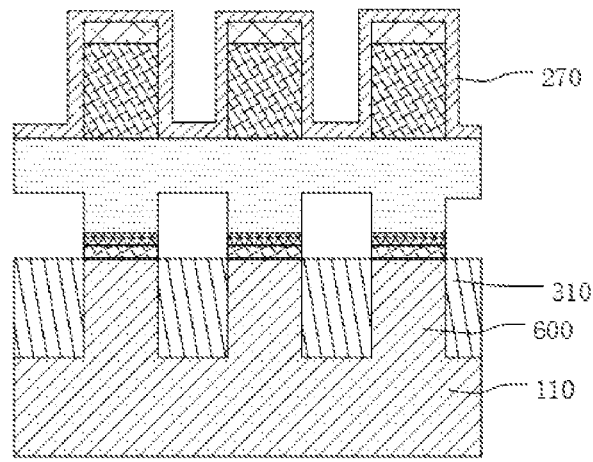
FIG. 28 is a cross-sectional view taken along B-B in FIG. 26.

As shown in FIGS. 26, 27, and 28, referring to FIGS. 20, 21, and 22, part of the initial conductive structure 230 in each of the second parts 202 of the initial word line structures 200 is removed through dry etching or wet etching, such that the bottom surface of the first part 201 of the initial word line structure 200 is lower than the bottom surface of the retained second part 202 of the initial word line structure 200.

In some embodiments, during formation of the semiconductor structure, the initial word line structures are formed, and then the initial structure is etched to form the active area structures. The sequence of forming the active area structures and the initial word line structures for the semiconductor device is adjusted. In the process of manufacturing the active area structures, the isolation trenches formed exposes the second parts of the initial word line structures, providing a process window for removing the second parts of the initial word line structures. The second parts of the initial word line structures can be etched via the process window, to remove parts of the initial conductive structures, allowing the bottom surfaces of the initial conductive structures covered by the active area structures to be lower than the initial conductive structures in the isolation trenches, thus reducing the volume of the initial conductive structures in the isolation trenches. This prevents charge in the initial conductive structures covered by the active area structures from moving to the initial conductive structures located in the isolation trenches when the word line structures are in the cutoff state, thus reducing the Row Hammer Effect.

Figure 2:
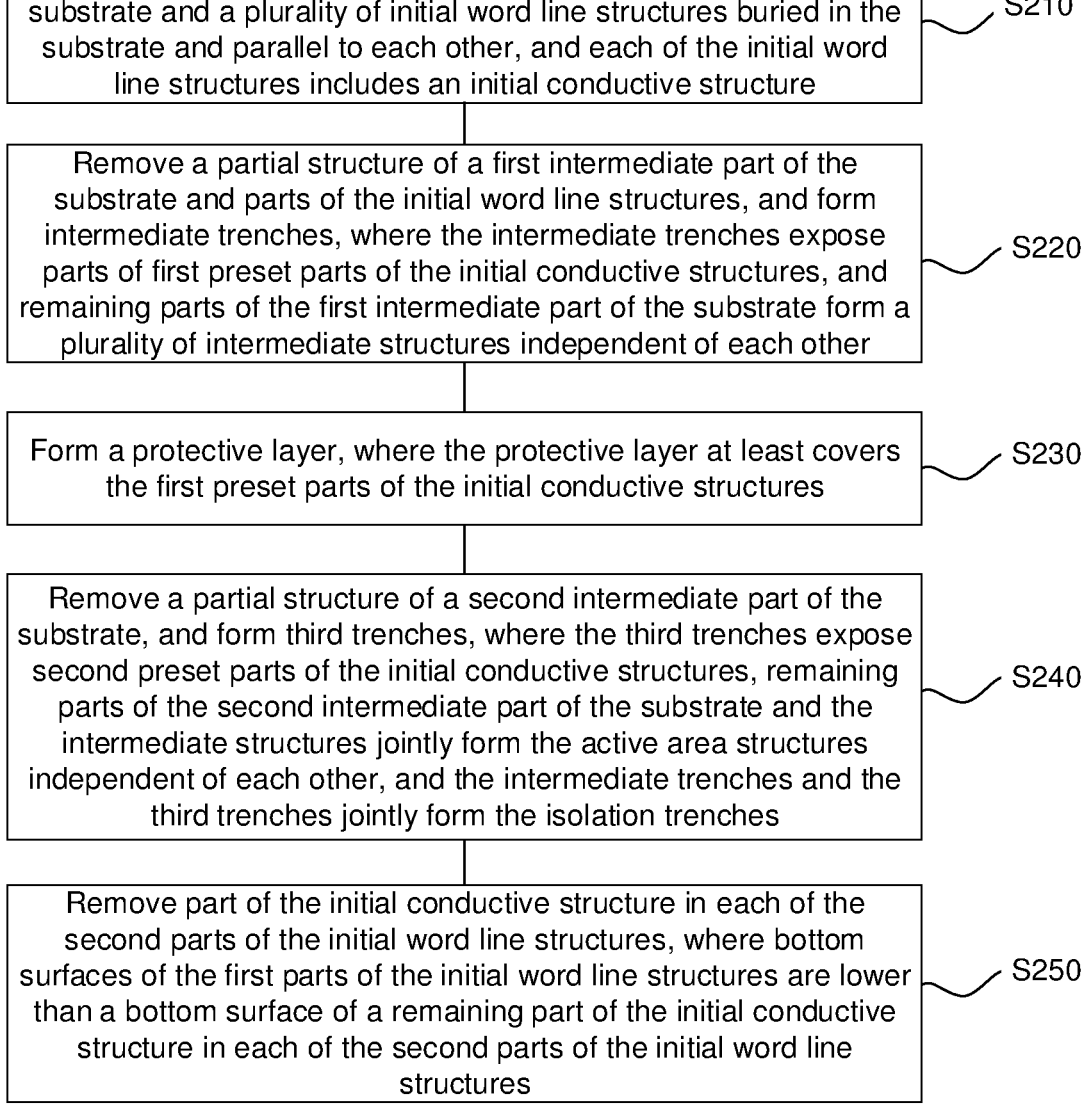
FIG. 2 is a flowchart of a method of manufacturing a semiconductor structure according to an exemplary embodiment.

An exemplary embodiment of the present disclosure provides a method of manufacturing a semiconductor structure, as shown in FIG. 2. a method of manufacturing a semiconductor structure provided according to an exemplary embodiment of the present disclosure includes:

Step S210: Provide an initial structure, where the initial structure includes a substrate and a plurality of initial word line structures buried in the substrate and parallel to each other, and each of the initial word line structures includes an initial conductive structure.

Step S210 in some embodiments is implemented in the same manner as step S110 of the foregoing embodiment, and will not be described in detail again herein.

Step S220: Remove a partial structure of a first intermediate part of the substrate and parts of the initial word line structures, and form intermediate trenches, where the intermediate trenches expose parts of first preset parts of the initial conductive structures, and remaining parts of the first intermediate part of the substrate form a plurality of intermediate structures independent of each other.

Figure 16:
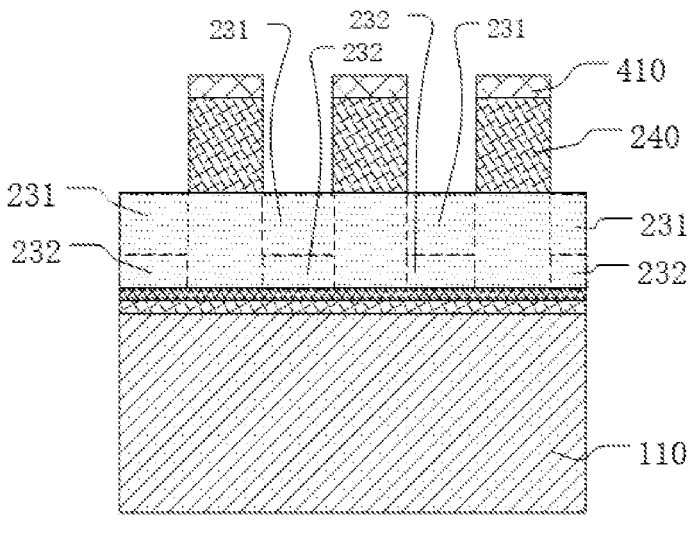
FIG. 16 is a cross-sectional view, taken along B-B, of forming an intermediate trench in a method of manufacturing a semiconductor structure according to an exemplary embodiment.
Figure 17:
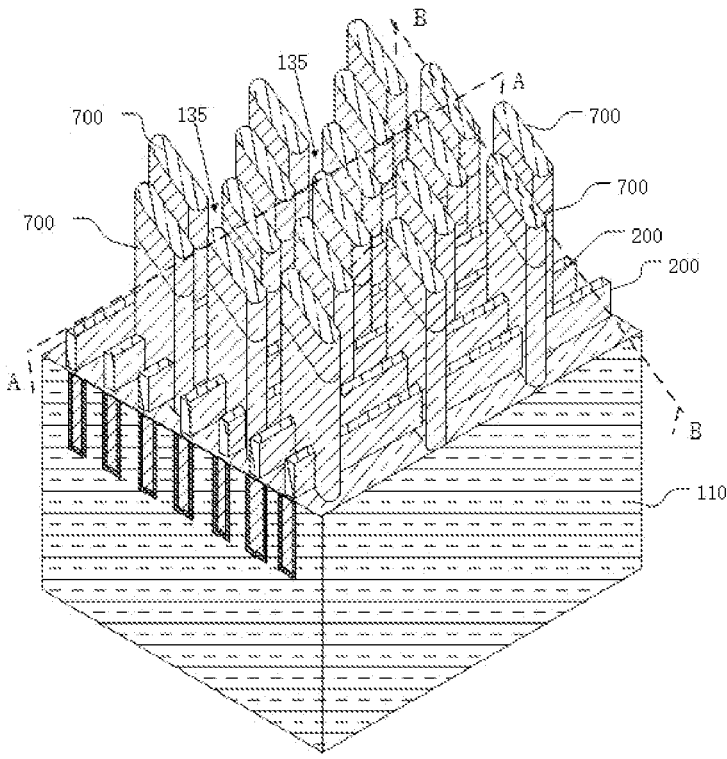
FIG. 17 is a schematic diagram of forming a protective layer in a method of manufacturing a semiconductor structure according to an exemplary embodiment.
Figure 18:
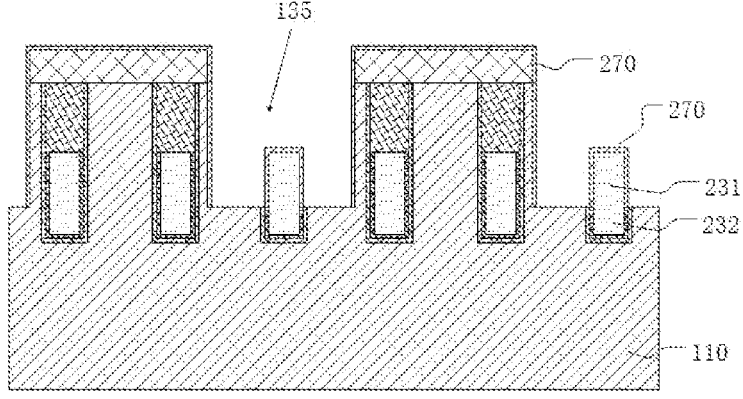
FIG. 18 is a cross-sectional view taken along A-A in FIG. 17.

As shown in FIGS. 16, 17, and 18, referring to FIG. 6, the partial structure of the first intermediate part 111 of the substrate 110 and parts of the initial word line structures 200 can be removed through dry etching and wet etching, to form the intermediate trenches 135. The intermediate trenches 135 expose parts of the first preset parts 231 of the initial conductive structures 230. In addition, in some embodiment, the intermediate trenches 135 separate the intermediate structures 700 into a plurality of island-shaped structures arranged independently.

According to an exemplary embodiment of the present disclosure, some embodiments are further descriptions about step S220 in the foregoing embodiment.

In some embodiments, each of the initial word line structures at least includes an initial conductive structure 230 and an initial barrier structure 220 formed between the substrate 110 and the initial conductive structure 230. In some embodiments, the top surface of the initial conductive structure 230 is lower than the top surface of the substrate 110.

The removing the partial structure of the first intermediate part of the substrate and parts of the initial word line structures, and forming the intermediate trenches includes: Step S221: Remove a partial structure of the substrate located on top surfaces of the initial conductive structures, and form first trenches, where the first trenches expose top surfaces of the second parts of the initial word line structures.

Figure 12:
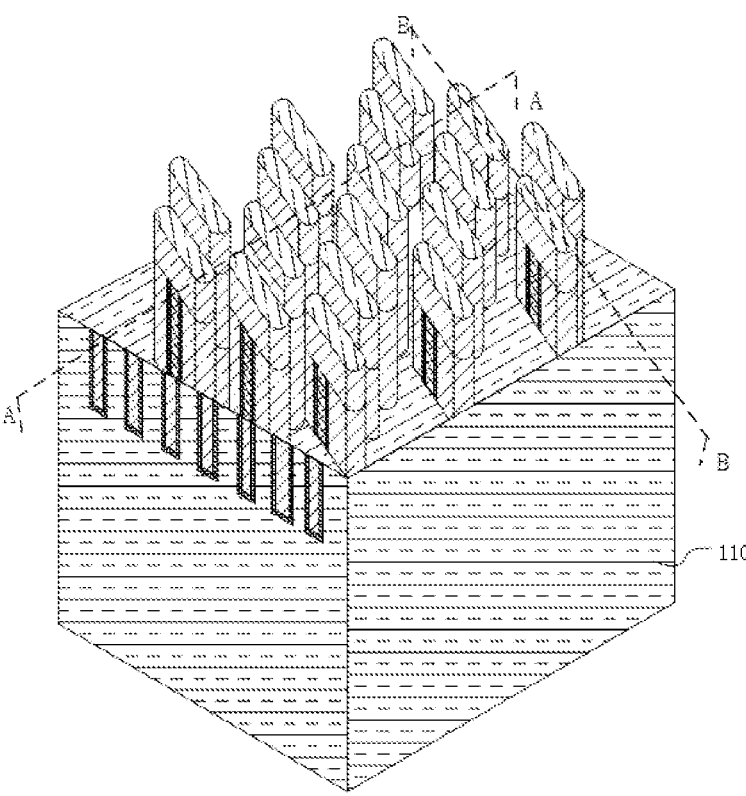
FIG. 12 is a schematic diagram of forming a first trench in a method of manufacturing a semiconductor structure according to an exemplary embodiment.
Figure 13:
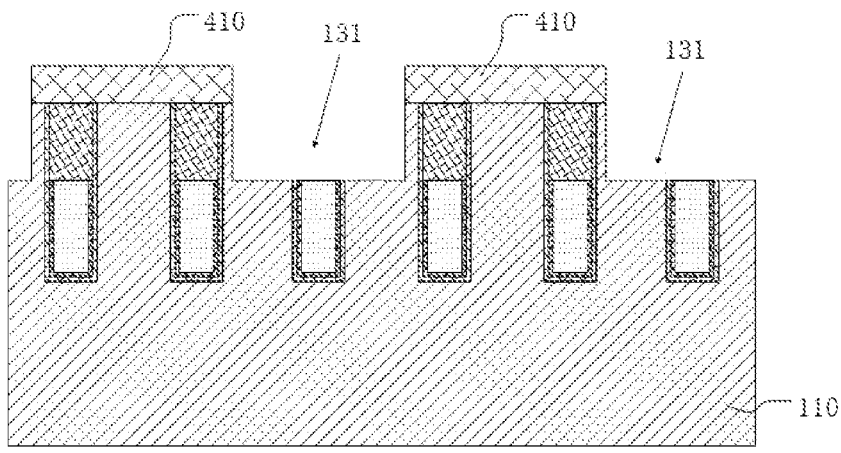
FIG. 13 is a cross-sectional view taken along A-A in FIG. 12.
Figure 14:
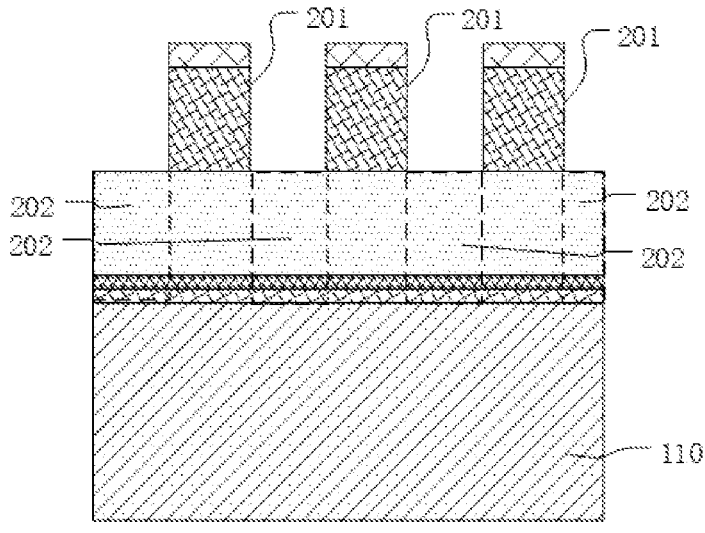
FIG. 14 is a cross-sectional view taken along B-B in FIG. 12.

As shown in FIGS. 12, 13, and 14, referring to FIG. 6, the partial structure of the substrate 110 located on top surfaces of the initial conductive structures 230 is removed through dry etching or wet etching process to form the first trenches 131. The first trenches 131 separate the substrate 110 located on the top surfaces of the initial conductive structures 230 into a plurality of island-shaped structures arranged independently. The first trenches 131 expose the top surfaces of the initial conductive structures 230 in the second parts 202 of the initial word line structures 200.

Step S222: Remove the substrate covering the first preset parts of the initial conductive structures and remove the initial barrier structures covering the first preset parts of the initial conductive structures, and form second trenches, where the second trenches expose the first preset parts of the initial conductive structures, and the first trenches and the second trenches jointly form the intermediate trenches.

Figure 15:
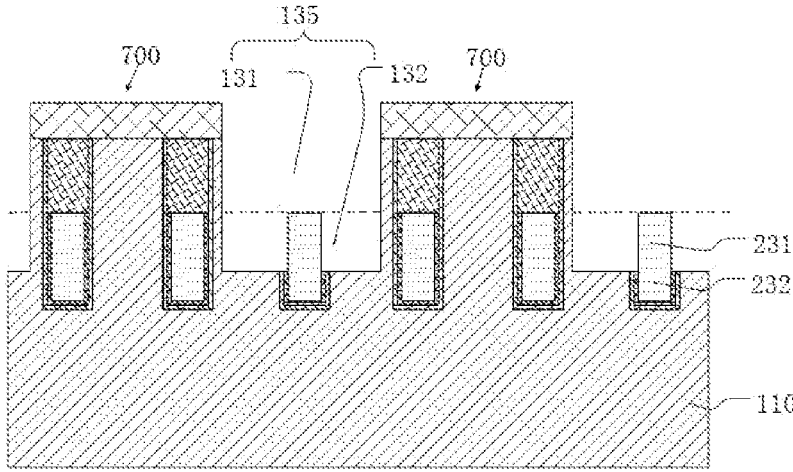
FIG. 15 is a cross-sectional view, taken along A-A, of forming an intermediate trench in a method of manufacturing a semiconductor structure according to an exemplary embodiment.

As shown in FIGS. 15 and 16, referring to FIG. 12, the island-shaped structures and the second parts 202 of the initial word line structures 200 are used as a mask to remove, through dry etching or wet etching, part of the substrate 110 and the initial barrier structures 220 covering the first preset parts 231 of the initial conductive structures 230. The first preset parts 231 of the initial conductive structures 230 are exposed to form the second trenches 132, where the first trenches 131 and the second trenches 132 jointly form the intermediate trenches 135.

The height of the first preset part 231 of the initial conductive structure 230 is greater than two-thirds of the height of the second part 202 of the initial word line structure 200. While the interference between adjacent first parts 201 of the initial word line structure 200 is reduced, the contact resistance is taken into account between the first preset part 231 of the initial conductive structure 230 and the initial conductive structure 230 covered by the active area structure 600, ensuring the semiconductor structure has good electrical properties.

Step S230: Form a protective layer, where the protective layer at least covers the first preset parts of the initial conductive structures.

Figure 19:
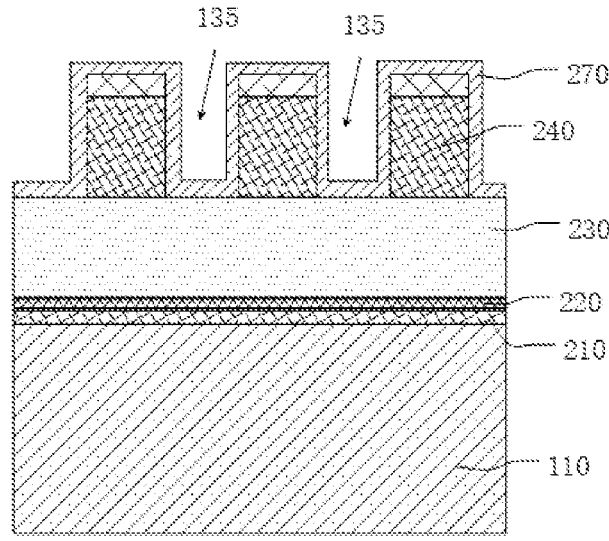
FIG. 19 is a cross-sectional view taken along B-B in FIG. 17.

As shown in FIGS. 17, 18, and 19, referring to FIGS. 15 and 16, the semiconductor structure can be placed in a nitrogen-containing plasma environment to form a protective layer 270 on the surfaces of the first preset parts 231 of the initial conductive structures 230 exposed by the semiconductor structure. In some embodiments, the protective layer 270 further covers the intermediate structures 700.

In some embodiments, the semiconductor structure is placed in an ion emission environment at 600° C. to 800° C. under a pressure of 1 pa to 10 pa, and nitrogen ($N_2$) or ammonia ($NH_3$) is used as the nitriding gas for emitting the plasma into the semiconductor structure with a plasma intensity of 600 W to 2000 W to form the protective layer 270.

As shown in FIGS. 17, 18, and 19, referring to FIGS. 15 and 16, the protective layer 270 covers the surfaces of the first preset parts 231 of the initial conductive structures 230 and the intermediate structures 700, preventing the first preset parts 231 of the initial conductive structures 230 and the intermediate structures 700 from being damaged in the subsequent process, and ensuring the integrity of the first preset parts 231 of the initial conductive structures 230 and the intermediate structures 700, thus improving the yield of the semiconductor structure formed finally.

Step S240: Remove a partial structure of a second intermediate part of the substrate, and form third trenches, where the third trenches expose second preset parts of the initial conductive structures, remaining parts of the second intermediate part of the substrate and the intermediate structures jointly form the active area structures independent of each other, and the intermediate trenches and the third trenches jointly form the isolation trenches.

As shown in FIGS. 20, 21, and 22, referring to FIGS. 6 and 17, the dry etching or wet etching is continuously used to remove the partial structure of the second intermediate part 112 of the substrate 110, to form the third trenches 133. The bottom surfaces of the third trenches 133 are lower than the bottom surfaces of the initial word line structures 200, and the third trenches 133 expose the second preset parts 232 of the initial conductive structures 230.

For example, the removing the partial structure of the second intermediate part of the substrate, and forming the third trenches includes:

Step S241: Remove the second intermediate part of the substrate through longitudinal etching process by using the intermediate structures and the initial word line structures as a mask, and expose the second preset parts of the initial conductive structures.

Referring to FIG. 17, the intermediate structures 700 and the initial word line structures 200 are used as the mask to etch the second intermediate part 112 of the substrate 110 through the dry etching process. In some embodiments, with the extension direction perpendicular to the substrate 110 and perpendicular to the initial word line structure 200 being longitudinal for etching, the second intermediate part 112 of the substrate 110 is subject to the dry etching process which is anisotropic etching. The second intermediate part 112 of the substrate 110 is partially removed through etching, to expose the second preset parts 232 of the initial conductive structures 230.

Step S242: Remove, through lateral etching process, the second intermediate part of the substrate below the second parts of the initial word line structures. The second intermediate part of the substrate covered by the bottom surfaces of the second parts of the initial word line structures is removed through the lateral etching process.

After step S241 of removing part of the second intermediate part 112 of the substrate 110, the second intermediate part 112 of the substrate 110 covered by the initial word line structures 200 are retained. In some embodiments, with the extension direction of the initial word line structures 200 being lateral for etching, the second intermediate part 112 of the substrate 110 is subject to the anisotropic etching. Referring to FIGS. 20, 21, and 22, the second intermediate part 112 of the substrate 110 covered by the second parts 202 of the initial word line structures 200 are removed to form the third trenches 133.

In this embodiment, the anisotropic etching is performed twice to remove a part structure of the second intermediate part 112 of the substrate 110, and only the second intermediate part 112 of the substrate 110 covered by the intermediate structures 700 is retained. The retained second intermediate part 112 of the substrate 110 and the retained substrate 110 in the intermediate structures 700 jointly form the active area structures 600. The second parts 202 of the initial word line structures 200 are suspended in the third trenches 133 (referring to FIG. 21), reducing the difficulty of etching the second parts 202 of the initial word line structures 200 and preventing the active area structures 600 from being damaged when the second parts 202 of the initial word line structures 200 are partially removed, thus improving the yield of the semiconductor structure.

Step S250: Remove part of the initial conductive structure in each of the second parts of the initial word line structures, where bottom surfaces of the first parts of the initial word line structures are lower than a bottom surface of a remaining part of the initial conductive structure in each of the second parts of the initial word line structures.

In some embodiments, the removing part of the initial conductive structure 230 in each of the second parts 202 of the initial word line structures 200 includes:

S251: Form a first dielectric layer filled in the isolation trenches, where a top surface of the first dielectric layer is flush with lower surfaces of the initial word line structures.

Figure 23:
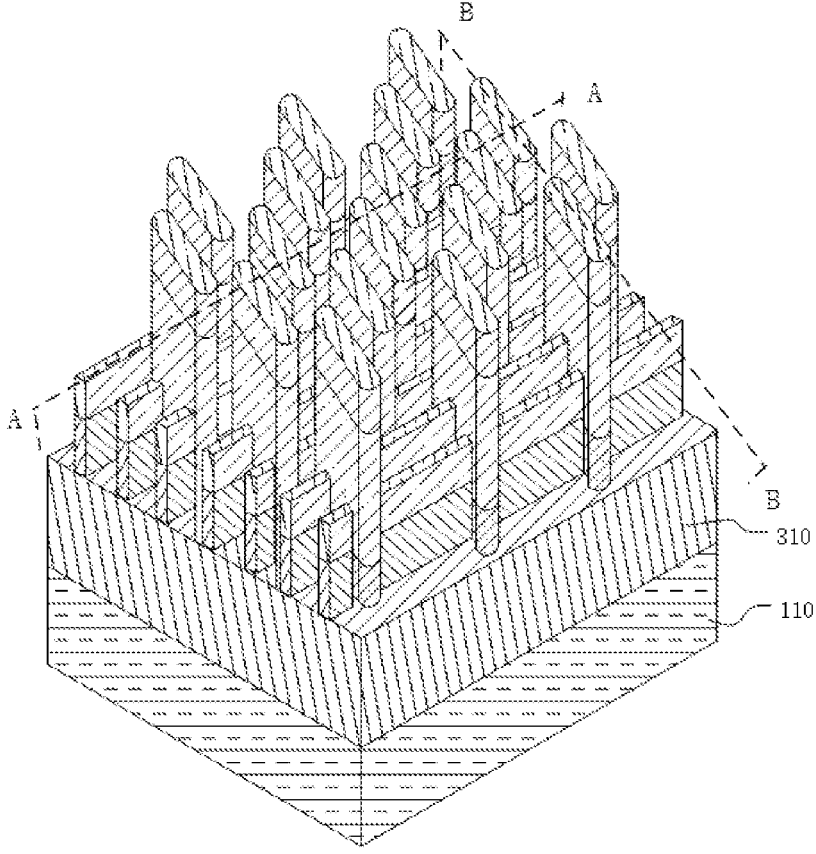
FIG. 23 is a schematic diagram of forming a first dielectric layer in a method of manufacturing a semiconductor structure according to an exemplary embodiment.
Figure 24:
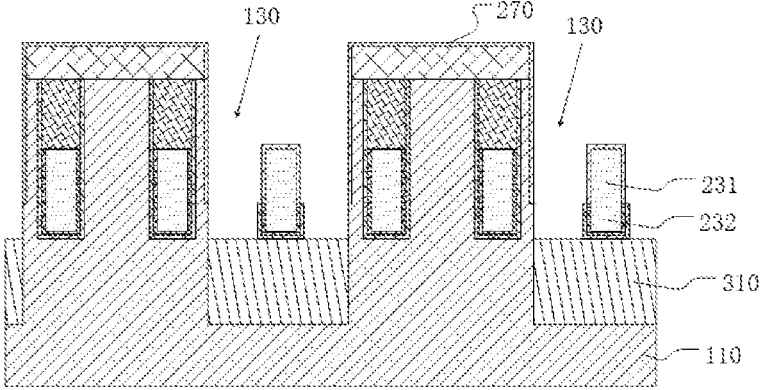
FIG. 24 is a cross-sectional view taken along A-A in FIG. 23.
Figure 25:
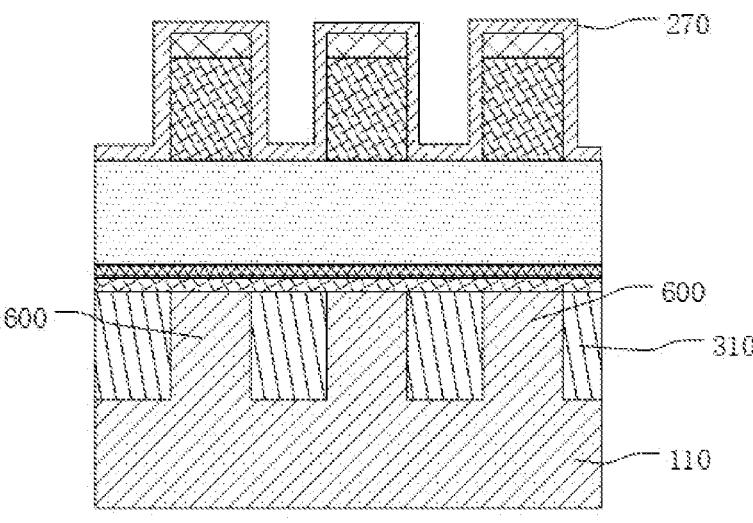
FIG. 25 is a cross-sectional view taken along B-B in FIG. 23.

As shown in FIGS. 23, 24, and 25, referring to FIG. 20, a first dielectric layer 310 can be formed by depositing, through atomic layer deposition (ALD) or chemical vapor deposition (CVD), a low-k dielectric material for filling parts of the isolation trenches 130. The first dielectric layer 310 covers the substrate 110 exposed by the third trenches 133, and the top surface of the first dielectric layer 310 is flush with the lower surfaces of the initial word line structures 200. The material of the first dielectric layer 310 may be silicon nitride, silicon oxide, or silicon oxynitride.

S252: Remove the initial barrier structures covering the second preset parts of the initial conductive structures in the second parts of the initial word line structures, and remove the second preset parts of the initial conductive structures.

As shown in FIGS. 26, 27, and 28, referring to FIGS. 22, 23, and 24, the initial word line structures 200 are etched through dry or wet etching process, to remove the initial barrier structures 220 covering the second preset parts 232 of the initial conductive structures 230, and expose the second preset parts 232 of the initial conductive structures 230, and then the second preset parts 232 of the initial conductive structures 230 are removed through etching. Because the first preset parts 231 of the initial conductive structures 230 and the intermediate structures 700 have been covered by the protective layer 270, the first preset parts 231 of the initial conductive structures 230 and the intermediate structures 700 are retained during this etching.

Referring to FIGS. 14 and 16, the first preset part 231 and the second preset part 232 of the initial conductive structure 230 both belong to the second part 202 of the initial word line structure 200. The first preset part 231 of the initial conductive structure 230 belongs to the retained second part 202 of the initial word line structure 200 in step S250. The second preset part 232 of the initial conductive structure 230 belongs to the removed second part 202 of the initial word line structure 122 in step S250.

In some embodiments, before the second preset parts 232 of the initial conductive structures 230 are removed, the protective layer 270 is first formed on the surfaces of the first preset parts 231 of the initial conductive structures 230 and the intermediate structures 700 that need to be retained, and the first dielectric layer 310 is then formed to cover the substrate 110 exposed by the third trenches 133. This prevents the first preset parts 231 of the initial conductive structures 230 and the intermediate structures 700 from being damaged during etching and prevents the substrate 110 covered by the intermediate structures 700 from being damaged during etching, thus ensuring the complete structure of the formed active area structures 600, improving the yield of the produced semiconductor structure.

In the semiconductor structure formed according to some embodiments, the first part of the initial word line structure is disposed in the active area structure, the partially retained second part of the initial word line structure is disposed in the protective layer, the bottom surface of the first part of the initial word line structure is lower than the bottom surface of the partially retained second part of the initial word line structure, the contact area between the first part of the initial word line structure and the partially retained second part of the initial word line structure is reduced, and when the semiconductor structure is in the conducted state, the interference between adjacent first parts of the initial word line structure is reduced.

As shown in FIG. 3, an exemplary embodiment of the present disclosure provides a method of manufacturing a semiconductor structure, including:

Step S310: Provide an initial structure, where the initial structure includes a substrate and a plurality of initial word line structures buried in the substrate and parallel to each other, and each of the initial word line structures includes an initial conductive structure.

According to some embodiments, the providing the initial structure includes:

S311: Provide an initial substrate.

Figure 4:
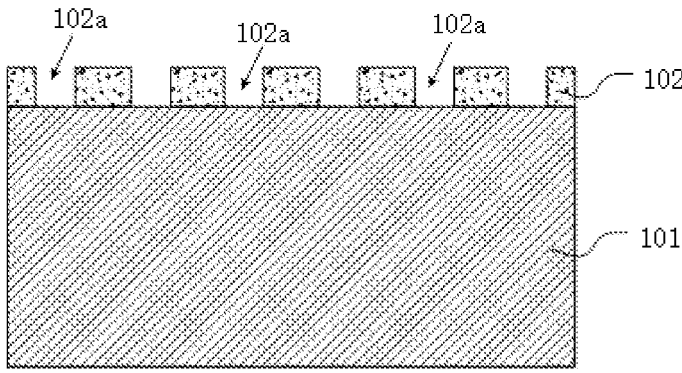
FIG. 4 is a schematic diagram of forming a word line mask on an initial substrate in a method of manufacturing the semiconductor structure according to an exemplary embodiment.

As shown in FIG. 4, the initial substrate 101 may be made of a semiconductor material. The semiconductor material may be one or more selected from the group consisting of silicon, germanium, a silicon-germanium compound, and a silicon-carbon compound.

S312: Remove parts of the initial substrate, and form word line trenches.

Figure 5:
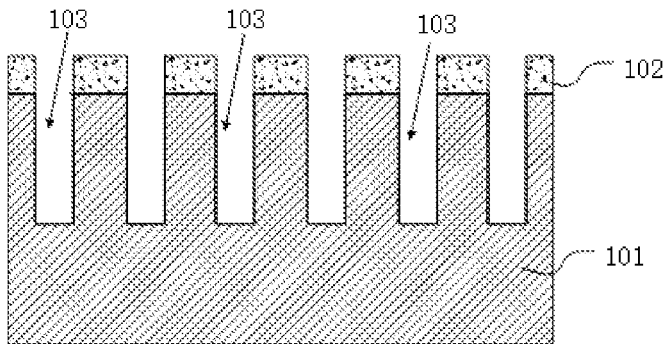
FIG. 5 is a schematic diagram of forming a word line trench in an initial substrate in a method of manufacturing a semiconductor structure according to an exemplary embodiment.

As shown in FIG. 4, a word line mask 102 is formed, the word line mask 102 including a word line pattern 102*a*, and the word line pattern 102*a* exposing part of the top surface of the initial substrate 101. As shown in FIG. 5, referring to FIG. 4, the initial substrate 101 is partially removed through etching according to the word line mask 102, to form a plurality of word line trenches 103 in the initial substrate 101. In some embodiments, the word line trenches 103 are equally spaced apart in parallel.

S313: Form an initial gate oxide layer, where the initial gate oxide layer covers the word line trench.

As shown in FIG. 7, referring to FIG. 5, the gate oxide can be deposited through ALD or CVD, and the gate oxide covers the word line trench 103 to form the initial gate oxide layer 210. In some embodiments, the initial gate oxide layer 210 is made of silicon oxide.

S314: Form an initial barrier structure, where the initial barrier structure covers the initial gate oxide layer.

As shown in FIG. 7, referring to FIG. 5, the barrier material can be deposited through ALD or CVD. The barrier material covers the word line trench 103 on which the initial gate oxide layer 210 is deposited to form the initial barrier structure 220. The initial barrier structure 220 may be made of titanium or a titanium compound or may be tantalum or a tantalum compound.

In some embodiments, the material of the initial barrier structure 220 includes titanium nitride. With ammonia ($NH_3$) or a mixture of nitrogen ($N_2$) and hydrogen ($H_2$) as the reaction gas, ALD is performed on titanium nitride to form initial barrier structure 220.

S315: Form an initial conductive structure, where the initial conductive structure is filled in inside of the initial barrier structure, and a top surface of the initial conductive structure is lower than a top surface of the initial substrate.

As shown in FIG. 7, referring to FIG. 5, a conductive metal can be deposited through ALD or CVD to fill the word line trench 103. Part of the conductive metal is partially etched back for removal. The retained conductive metal forms the initial conductive structure 230, the top surface of the initial conductive structure 230 being lower than the top surface of the initial substrate 101. The material of the initial conductive structure 230 may include tungsten metal (W) or a tungsten compound in some embodiments.

In some embodiments, the conductive material is etched back to form the initial conductive structure 230, while the initial barrier structure 220 is etched back, such that the top surface of the initial barrier structure 220 is flush with the top surface of the initial conductive structure 230.

S316: Form an initial insulation structure, where the initial insulation structure covers the top surface of the initial conductive structure, and a top surface of the insulation structure is flush with the top surface of the initial substrate.

As shown in FIG. 7, referring to FIG. 5, the insulation material can be deposited through CVD or PVD to cover the top surface of the initial conductive structure 230 and fill the word line trench 103, thus forming the initial insulation structure 240.

As shown in FIGS. 6, 7, and 8, in some embodiments, initial word line structures 200 are provided in parallel in the initial substrate 101. The initial word line structures 200 and the retained initial substrate 101 jointly form the initial structure 100, with the retained initial substrate 101 used as the substrate 110 in the initial structure 100. The initial word line structure 200 includes an initial gate oxide layer 210, the initial barrier structure 220, the initial conductive structure 230, and the initial insulation structure 240.

Step S320: Form a mask layer, where the mask layer covers a partial top surface of the initial structure, and projection of the mask layer on the initial structure is a plurality of island shaped patterns arranged in a parallel array.

Figure 9:
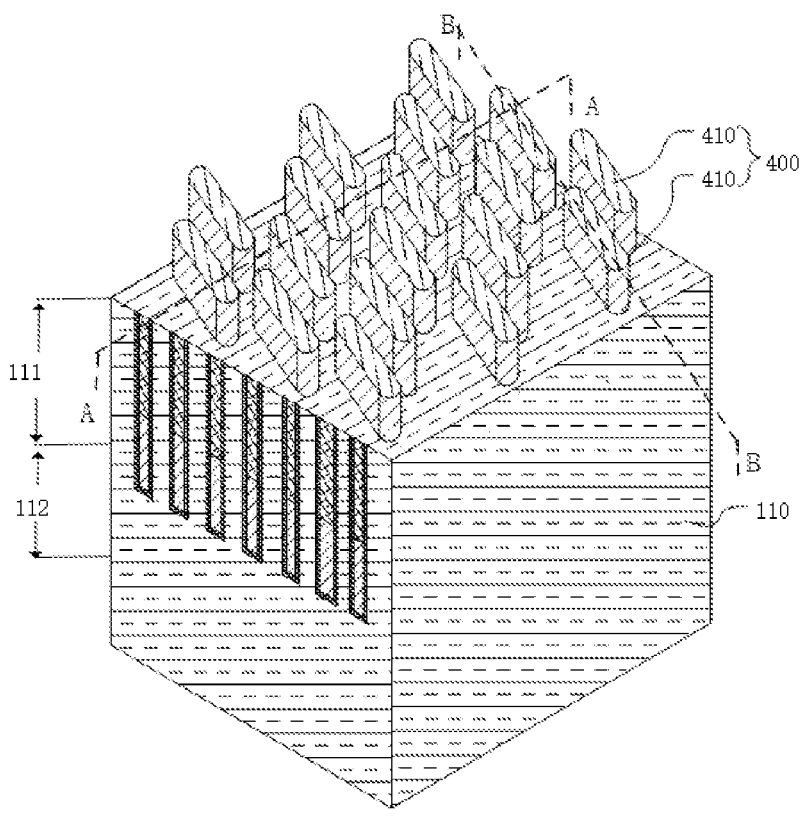
FIG. 9 is a schematic diagram of forming a mask layer on a top surface of an initial structure in a method of manufacturing a semiconductor structure according to an exemplary embodiment.
Figure 10:
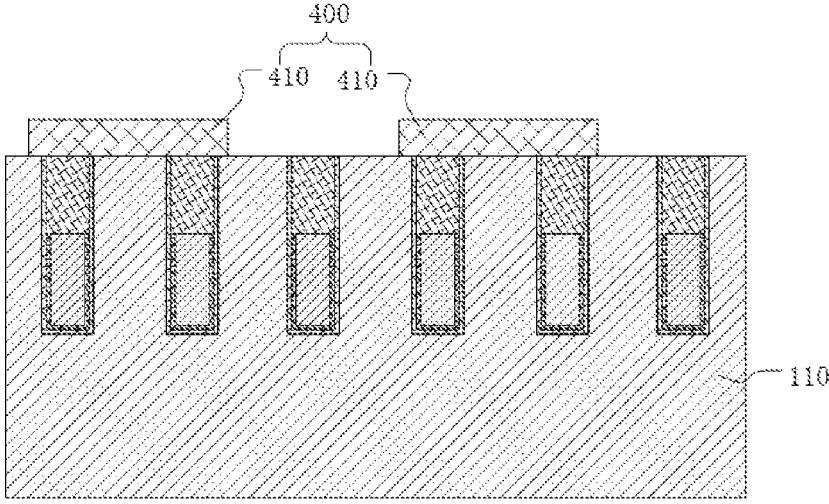
FIG. 10 is a cross-sectional view taken along A-A in FIG. 9.
Figure 11:
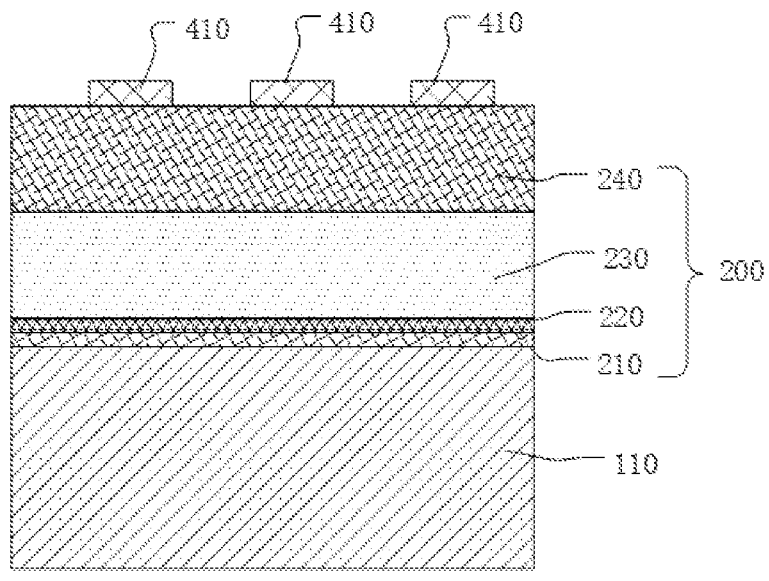
FIG. 11 is a cross-sectional view taken along B-B in FIG. 9.

As shown in FIGS. 9, 10, and 11, referring to FIGS. 6, 7, and 8, the mask layer 400 includes a plurality of submasks 410 in the same island-like shape. The island-like submasks 410 are the same and arranged in parallel in an array on the top surface of the initial structure 100. In some embodiments, the extension direction of the initial word line structure 200 is the first direction, and the extension direction of the island-like submask 410 is the second direction, and the first direction non-perpendicularly intersects the second direction.

Projection of the island-like submask 410 on the initial structure 100 is in an island shape, and two ends of each island shape each intersect an initial word line structure 200.

Step S330: Remove a partial structure of a first intermediate part of the substrate and parts of the initial word line structures, and form intermediate trenches, where the intermediate trenches expose parts of first preset parts of the initial conductive structures, and remaining parts of the first intermediate part of the substrate form a plurality of intermediate structures independent of each other.

In some embodiments, the removing the partial structure of the first intermediate part 111 of the substrate 110 and parts of the initial word line structures 200 according to the mask layer 400 includes: removing the partial structure of the substrate 110 on the top surfaces of the initial conductive structures 230, and removing part of the substrate 110 covering the first preset parts 231 of the initial conductive structures 230 and the initial barrier structures 220 covering the first preset parts 231 of the initial conductive structures 230.

As shown in FIGS. 12, 13, 14, 15, and 16, referring to FIGS. 9, 10, and 11, the removing the partial structure of the substrate 110 on the top surfaces of the initial conductive structures 230 includes: removing the substrate 110 exposed by the mask layer 400 and removing the initial insulation structures 240 exposed by the mask layer 400 and the initial gate oxide layers 210 covering the initial insulation structures 240, and performing etching until the upper surfaces of the initial conductive structures 230 are exposed. The remaining parts of the initial insulation structures 240 and the initial gate oxide layers 210 covering the remaining parts of the initial insulation structures 240 are located in the remaining part of the substrate 110. The remaining parts of the initial insulation structures 240, the initial gate oxide layers 210 covering the remaining parts of the initial insulation structures 240, and the remaining part of the substrate 110 jointly form the intermediate structures 700, the intermediate structures 700 being of island-shaped structures arranged independently.

Step S340: Form a protective layer, where the protective layer at least covers the first preset parts of the initial conductive structures.

Step S340 in some embodiments is implemented in the same manner as step S230 of the foregoing embodiment, and will not be described in detail again herein. In some embodiments, as shown in FIGS. 16, 17, and 18, the protective layer 270 formed covers exposed outer surfaces of the first preset parts 231 of the initial conductive structures 230, intermediate structures 700, and mask layer 400.

Step S350: Remove a partial structure of a second intermediate part of the substrate, and form third trenches, where the third trenches expose second preset parts of the initial conductive structures, remaining parts of the second intermediate part of the substrate and the intermediate structures jointly form the active area structures independent of each other, and the intermediate trenches and the third trenches jointly form the isolation trenches.

Step S350 in some embodiments is implemented in the same manner as step S240 of the foregoing embodiment, and will not be described in detail again herein.

Step S360: Remove part of the initial conductive structure in each of the second parts of the initial word line structures, where bottom surfaces of the initial conductive structures covered by the active area structures are lower than a bottom surface of a remaining part of the initial conductive structure in each of the second parts of the initial word line structures.

Step S360 in some embodiments is implemented in the same manner as step S250 of the foregoing embodiment, and will not be described in detail again herein.

Step S370: Form a second dielectric layer, where the second dielectric layer is filled in the isolation trenches, a top surface of the second dielectric layer is flush with top surfaces of the active area structures, and the first dielectric layer and the second dielectric layer jointly form an isolation structure.

Figure 29:
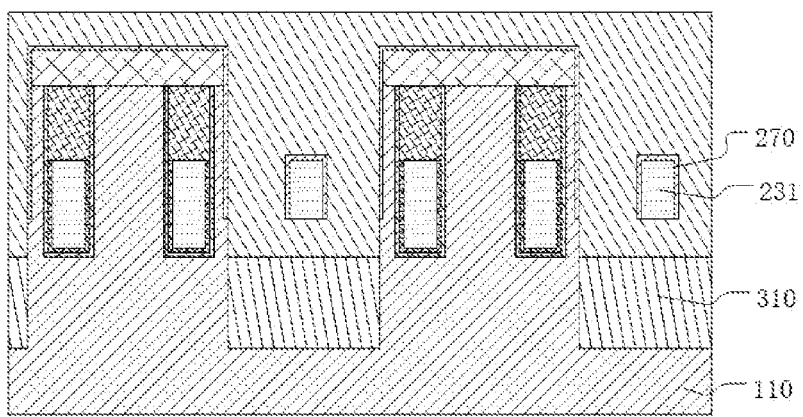
FIG. 29 is a cross-sectional view, taken along A-A, of filling an isolation trench in a method of manufacturing a semiconductor structure according to an exemplary embodiment.
Figure 30:
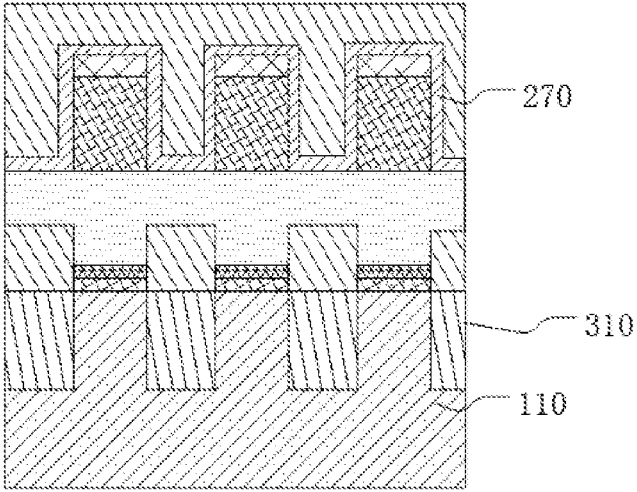
FIG. 30 is a cross-sectional view, taken along B-B, of filling an isolation trench in a method of manufacturing a semiconductor structure according to an exemplary embodiment.

As shown in FIGS. 29 and 30, referring to FIGS. 25, 26, and 27, a low-k dielectric material can be deposited through ALD or CVD to fill the isolation trenches 130 and cover the top surface of the initial structure 100. The mask layer 400, the protective layer 270 covering the mask layer 400, and part of the low-k dielectric material are removed to expose the top surfaces of the active area structures. The remaining part of the low-k dielectric material forms the second dielectric layer 320 (referring to FIG. 31), and the first dielectric layer 310 and the second dielectric layer 320 jointly form the isolation structure 300 (referring to FIG. 31). For example, the second dielectric layer 320 may be made of silicon nitride, silicon oxide, and silicon oxynitride. The second dielectric layer 320 and the first dielectric layer 310 may be made of the same material or different materials.

In some embodiments, the initial word line structures are equally spaced apart in parallel in the initial structure. The mask layer is patterned depending on the arrangement of the initial word line structure, the patterned mask layer including island-like submasks arranged independently in parallel, allowing for the alignment of the positions of the formed active area structure and the initial word line structure. In some embodiments, during the formation of the semiconductor structure, the process sequence of forming the active area structure and forming the initial word line structure is adjusted, which ensures the alignment precision of the active area structure and the word line structure and makes the structure precision and dimension precision of the semiconductor structure higher, thus improving the yield of the semiconductor structure.

Figure 31:
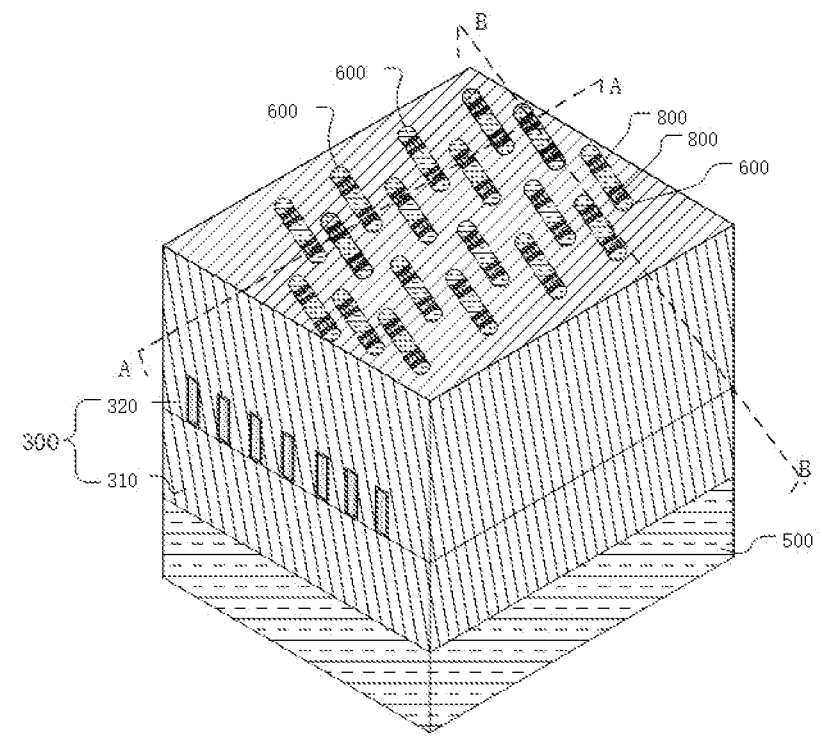
FIG. 31 is a schematic diagram of a semiconductor structure according to an exemplary embodiment.
Figure 32:
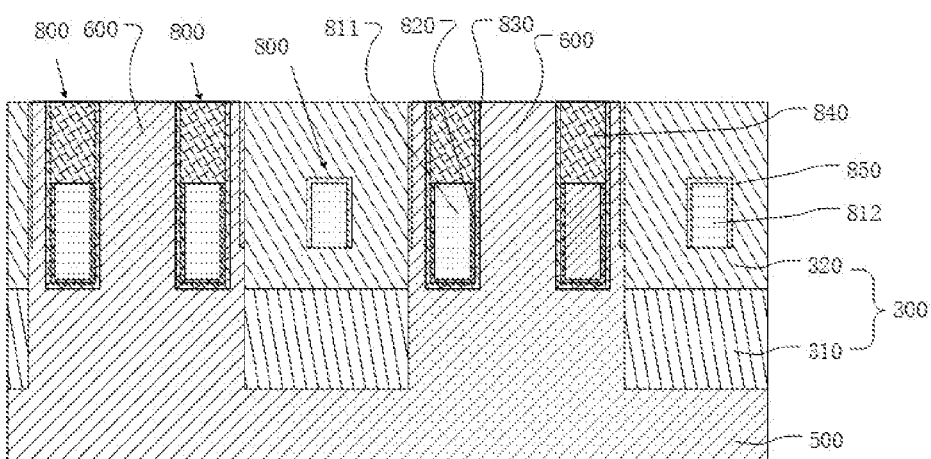
FIG. 32 is a cross-sectional view taken along A-A in FIG. 31.
Figure 33:
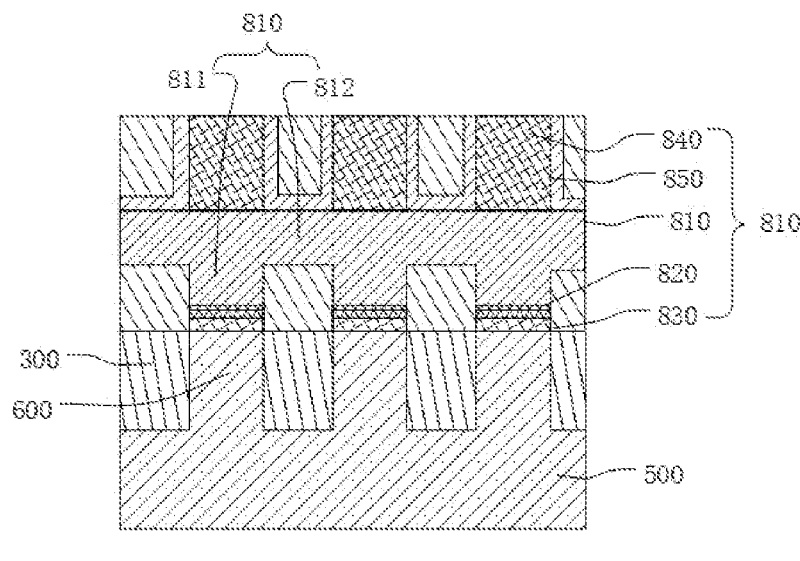
FIG. 33 is a cross-sectional view taken along B-B in FIG. 31.

According to an exemplary embodiment of the present disclosure, some embodiments provide a semiconductor structure. As shown in FIGS. 31, 32, and 33, the semiconductor structure includes a base 500, a plurality of active area structures 600 arranged independently on the base 500, and an isolation structure 300 located around adjacent two of the active area structures 600. The semiconductor structure further includes word line structures 800. Each of the word line structures includes a conductive structure 810. The conductive structure 810 includes a contact part 811 disposed in the active area structure 600 and a connecting part 812 disposed in the isolation structure 300, a bottom surface of the contact part 811 of the conductive structure 810 being lower than a bottom surface of the connecting part 812 of the conductive structure 810.

In the semiconductor structure according to some embodiments, along the extension direction of the word line structure, the conductive structure 810 includes the contact part 811 and the connecting part 812 that are disposed alternatively. The contact part 811 penetrates through the active area structure 600, the connecting part 812 penetrates through the isolation structure 300, and the bottom surface of the contact part 811 of the conductive structure 810 is lower than the bottom surface of the connecting part 812. Reducing the dimension of the connecting part 812 reduces the interference of the connecting part 812 of the conductive structure 810 to the contact part 811 and further reduces the interference between adjacent contact parts 811. Such design reduces the Row Hammer Effect and is applicable to the semiconductor device with a smaller dimension and high integration.

According to an exemplary embodiment, most part of the semiconductor structure in some embodiments is the same as the foregoing embodiment. Some embodiments and the foregoing embodiment differ in that as shown in FIGS. 31, 32, and 33, each of the word line structures 800 further includes a first barrier structure 820, the first barrier structure 820 being disposed between the contact part 811 of the conductive structure 810 and the active area structure 600.

As shown in FIGS. 31, 32, and 33, each of the word line structures 800 further includes a gate oxide layer 830, the gate oxide layer 830 covering side walls and the bottom surface of the contact part 811 of the conductive structure 810. The gate oxide layer 830 is disposed between the contact part 811 of the conductive structure 810 and the active area structure 600. In some embodiments, the gate oxide layer 830 is disposed between the first barrier structure 820 and the active area structure 600.

As shown in FIGS. 31, 32, and 33, each of the word line structures 800 includes an insulation structure 840. The insulation structure 840 covers the top surface of the contact part 811 of the conductive structure 810, and the top surface of the insulation structure 840 is flush with the top surface of the active area structure 600.

As shown in FIGS. 31, 32, and 33, each of the word line structures 800 further includes a second barrier structure 850. The second barrier structure 850 at least covers the top surface and the side walls of the connecting part 812 of the conductive structure 810. In some embodiments, as shown in FIGS. 31, 32, and 33, the second barrier structure further covers the side wall of part of the active area structure 600.

In some embodiments, the top surface of the contact part 811 of the conductive structure 810 is flush with the top surface of the connecting part 812, and the height of the contact part 811 of the conductive structure 810 is greater than two-thirds of the height of the contact part 811.

In the semiconductor structure in some embodiments, the height of the connecting part 812 is reduced and the conduction function of the connecting part 812 connecting adjacent contact parts 811 is retained, but the contact area of the connecting part 812 and the contact part 811 is reduced. When the semiconductor structure is refreshed and read frequently, the interference of the connecting part 812 to the contact part 811 and the interference between adjacent contact parts 811 are reduced, thus reducing the charge leakage. This avoids performance degradation of the semiconductor structure due to the Row Hammer Effect.

The semiconductor structure according to the embodiments of the present disclosure may be included in a memory cell and a memory cell array.

The memory cell and the memory cell array may be included in a memory device and the memory device may be used in a dynamic random access memory (DRAM). However, the memory device may alternatively be applied in a static random-access memory (SRAM), a flash memory (flash EPROM), a ferroelectric random-access memory (Fe-RAM), a magnetic random access memory (MRAM), a phase change random-access memory (PRAM), or the like.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the present disclosure, part of an initial conductive structure in an isolation trench is removed, reducing the interference between adjacent initial conductive structures in an active area structure.

The invention claimed is:

1. A method of manufacturing a semiconductor structure, comprising:

providing an initial structure, wherein the initial structure comprises a substrate and a plurality of initial word line structures buried in the substrate and parallel to each other, and each of the initial word line structures comprises an initial conductive structure;

removing part of the substrate and parts of the initial word line structures, and forming isolation trenches, wherein a remaining part of the substrate is isolated by the isolation trenches to form a plurality of active area structures independent of each other, the active area structures cover first parts of the initial word line structures, and the isolation trenches expose second parts of the initial word line structures; and removing part of the initial conductive structure in each of the second parts of the initial word line structures, wherein bottom surfaces of the initial conductive structures covered by the active area structures are lower than a bottom surface of a remaining part of the initial conductive structure in each of the second parts of the initial word line structures.

2. The method of manufacturing a semiconductor structure according to claim 1, wherein the removing part of the substrate and parts of the initial word line structures comprises:

removing a partial structure of a first intermediate part of the substrate and parts of the initial word line structures, and forming intermediate trenches, wherein the intermediate trenches expose parts of first preset parts of the initial conductive structures, and remaining parts of the first intermediate part of the substrate form a plurality of intermediate structures independent of each other; and removing a partial structure of a second intermediate part of the substrate, and forming third trenches, wherein the third trenches expose second preset parts of the initial conductive structures, remaining parts of the second intermediate part of the substrate and the intermediate structures jointly form the active area structures independent of each other, and the intermediate trenches and the third trenches jointly form the isolation trenches.

3. The method of manufacturing a semiconductor structure according to claim 2, wherein each of the initial word line structures further comprises an initial barrier structure formed between the substrate and the initial conductive structure; and the removing a partial structure of a first intermediate part of the substrate and parts of the initial word line structures, and forming intermediate trenches comprises:

removing a partial structure of the substrate located on top surfaces of the initial conductive structures, and forming first trenches, wherein the first trenches expose top surfaces of the second parts of the initial word line structures; and removing the substrate covering the first preset parts of the initial conductive structures and removing the initial barrier structures covering the first preset parts of the initial conductive structures, and forming second trenches, wherein the second trenches expose the first preset parts of the initial conductive structures, and the first trenches and the second trenches jointly form the intermediate trenches.

4. The method of manufacturing a semiconductor structure according to claim 3, wherein the substrate retained on top surfaces of the initial word line structures form a plurality of island-shaped structures arranged independently; and the removing the substrate covering the first preset parts of the initial conductive structures comprises:

using the island-shaped structures and the top surfaces of the second parts of the initial word line structures as a mask to remove the substrate covering the first preset parts of the initial conductive structures.

5. The method of manufacturing a semiconductor structure according to claim 4, wherein the removing a partial structure of a second intermediate part of the substrate comprises:

removing the second intermediate part of the substrate through a longitudinal etching process by using the intermediate structures and the initial word line structures as a mask, and exposing the second preset parts of the initial conductive structures.

6. The method of manufacturing a semiconductor structure according to claim 5, wherein the removing a partial structure of a second intermediate part of the substrate further comprises:

removing, through a lateral etching process, the second intermediate part of the substrate covered by the second parts of the initial word line structures.

7. The method of manufacturing a semiconductor structure according to claim 6, wherein the removing part of the initial conductive structure in each of the second parts of the initial word line structures comprises:

forming a first dielectric layer filled in the isolation trenches, wherein a top surface of the first dielectric layer is flush with lower surfaces of the initial word line structures; and removing the initial barrier structures covering the second preset parts of the initial conductive structures in the second parts of the initial word line structures, and removing the second preset parts of the initial conductive structures.

8. The method of manufacturing a semiconductor structure according to claim 7, after the removing part of the initial conductive structure in each of the second parts of the initial word line structures, the method comprises:

forming a second dielectric layer, wherein the second dielectric layer is filled in the isolation trenches, a top surface of the second dielectric layer is flush with top surfaces of the active area structures, and the first dielectric layer and the second dielectric layer jointly form an isolation structure.

9. The method of manufacturing a semiconductor structure according to claim 2, after the removing a partial structure of a first intermediate part of the substrate and parts of the initial word line structures, and before the removing a partial structure of a second intermediate part of the substrate, the method comprises:

forming a protective layer, wherein the protective layer at least covers the first preset parts of the initial conductive structures.

10. The method of manufacturing a semiconductor structure according to claim 2, before the removing a partial structure of a first intermediate part of the substrate and parts of the initial word line structures, the method comprises:

forming a mask layer, wherein the mask layer covers a partial top surface of the initial structure, and projection of the mask layer on the initial structure is a plurality of island shaped patterns arranged in a parallel array.

11. The method of manufacturing a semiconductor structure according to claim 1, wherein the providing an initial structure comprises:

providing an initial substrate;

removing parts of the initial substrate, and forming word line trenches;

forming an initial gate oxide layer, wherein the initial gate oxide layer covers the word line trench;

forming an initial barrier structure, wherein the initial barrier structure covers the initial gate oxide layer;

forming an initial conductive structure, wherein the initial conductive structure is filled in inside of the initial barrier structure, and a top surface of the initial conductive structure is lower than a top surface of the initial substrate; and forming an initial insulation structure, wherein the initial insulation structure covers the top surface of the initial conductive structure, and a top surface of the initial insulation structure is flush with the top surface of the initial substrate; and the initial gate oxide layer, the initial barrier structure, the initial conductive structure, and the initial insulation structure form the initial word line structure.

12. A semiconductor structure, manufactured by the method of manufacturing a semiconductor structure according to claim 1, comprising:

a base, wherein a plurality of active area structures independent of each other are disposed on the base;

an isolation structure, wherein the isolation structure is located around the active area structures; and word line structures, wherein each of the word line structures comprises a conductive structure, the conductive structure comprises a contact part in the active area structure and a connecting part in the isolation structure, and a bottom surface of the contact part of the conductive structure is lower than a bottom surface of the connecting part of the conductive structure.

13. The semiconductor structure according to claim 12, wherein each of the word line structures further comprises a first barrier structure, and the first barrier structure is disposed between the contact part of the conductive structure and the active area structure.

14. The semiconductor structure according to claim 13, wherein each of the word line structures comprises an insulation structure, the insulation structure covers a top surface of the contact part of the conductive structure, and a top surface of the insulation structure is flush with a top surface of the active area structure.

15. The semiconductor structure according to claim 12, wherein each of the word line structures further comprises a second barrier structure, and the second barrier structure at least covers a top surface and side walls of the connecting part of the conductive structure.

16. The semiconductor structure according to claim 12, wherein each of the word line structures further comprises a gate oxide layer, the gate oxide layer covers side walls and the bottom surface of the contact part of the conductive structure, and the gate oxide layer is disposed between the contact part of the conductive structure and the active area structure.

17. The semiconductor structure according to claim 12, wherein the isolation structure comprises a first dielectric layer and a second dielectric layer, a top surface of the first dielectric layer is flush with lower surfaces of the contact part.

18. The semiconductor structure according to claim 17, wherein a top surface of the second dielectric layer is flush with top surfaces of the active area structures.

* * * * *